(12) United States Patent
Jeon et al.

(10) Patent No.: US 11,495,650 B2
(45) Date of Patent: Nov. 8, 2022

(54) DISPLAY APPARATUS

(71) Applicant: Samsung Display Co., Ltd., Yongin-si (KR)

(72) Inventors: Kyungjin Jeon, Yongin-si (KR); Soyoung Koo, Yongin-si (KR); Eoksu Kim, Yongin-si (KR); Junhyung Lim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 91 days.

(21) Appl. No.: 17/081,342

(22) Filed: Oct. 27, 2020

(65) Prior Publication Data

US 2021/0242291 A1 Aug. 5, 2021

(30) Foreign Application Priority Data

Jan. 30, 2020 (KR) .......................... 10-2020-0011355

(51) Int. Cl.
| | |
|---|---|
| *H01L 27/14* | (2006.01) |
| *H01L 27/32* | (2006.01) |
| *H01L 27/12* | (2006.01) |
| *H01L 29/66* | (2006.01) |

(Continued)

(52) U.S. Cl.
CPC ...... *H01L 27/3262* (2013.01); *H01L 27/3265* (2013.01); *H01L 27/3272* (2013.01); *H01L 27/3276* (2013.01); *H01L 21/0262* (2013.01); *H01L 21/02565* (2013.01); *H01L 27/124* (2013.01); *H01L 27/127* (2013.01); *H01L 27/1225* (2013.01); *H01L 27/1255* (2013.01); *H01L 29/66969* (2013.01); *H01L 29/7869* (2013.01); *H01L 29/78633* (2013.01); *H01L 2227/323* (2013.01)

(58) Field of Classification Search
CPC ............ H01L 27/3262; H01L 27/3265; H01L 27/3272; H01L 27/3276
USPC ............................................ 257/59, 72, 432
See application file for complete search history.

(56) References Cited

U.S. PATENT DOCUMENTS

| | | | |
|---|---|---|---|
| 10,084,031 B2 | 9/2018 | Park et al. | |
| 10,263,211 B2* | 4/2019 | Byun | .................. H01L 27/3272 |
| 10,461,141 B2 | 10/2019 | Choi | |

(Continued)

FOREIGN PATENT DOCUMENTS

| | | |
|---|---|---|
| CN | 108110010 A | 6/2018 |
| CN | 108873527 A | 11/2018 |

(Continued)

*Primary Examiner* — Tan N Tran
(74) *Attorney, Agent, or Firm* — Cantor Colburn LLP

(57) ABSTRACT

A display apparatus includes a thin film transistor facing a substrate with a buffer layer therebetween and including a semiconductor layer, a channel region, a source region, a drain region, and a gate electrode; a conductive pattern between the substrate and the semiconductor layer and connected to the semiconductor layer, the conductive pattern facing the semiconductor layer with the buffer layer therebetween; a contact hole in the buffer layer and exposing the conductive pattern to outside the buffer layer; and a display element which is electrically connected to the thin film transistor. The source region or the drain region extends through the contact hole in the buffer layer, to contact the conductive pattern and connect the semiconductor layer to the conductive pattern.

20 Claims, 13 Drawing Sheets

(51) Int. Cl.
　　　　*H01L 29/786*　　　　(2006.01)
　　　　*H01L 21/02*　　　　(2006.01)

(56) References Cited

U.S. PATENT DOCUMENTS

2016/0370621 A1* 12/2016 Huang ............... H01L 29/78633
2017/0338252 A1* 11/2017 Lee .................... H01L 27/1251

FOREIGN PATENT DOCUMENTS

| CN | 109166864 A | 1/2019 |
| KR | 1020180036818 A | 4/2018 |
| KR | 1020190048390 A | 5/2019 |

* cited by examiner

DISPLAY APPARATUS

This application claims priority to Korean Patent Application No. 10-2020-0011355, filed on Jan. 30, 2020, and all the benefits accruing therefrom under 35 U.S.C. § 119, the disclosure of which is incorporated herein in its entirety by reference.

BACKGROUND

1. Field

One or more embodiments relate to a display apparatus, and more particularly, to a display apparatus driven by a thin film transistor including an oxide semiconductor.

2. Description of Related Art

A display apparatus visually displays data. A display apparatus may be used as a display in a small-sized product such as a mobile phone, or a display in a large-sized product such as a television.

A display apparatus includes a plurality of pixels that emit light by receiving electrical signals in order to externally display images with the light. Each of the pixels includes a light-emitting device or a display element. An organic-light emitting display apparatus includes an organic light-emitting diode as a light-emitting device. In general, thin film transistors and organic light-emitting diodes are on a substrate and the organic light-emitting diodes generate and emit light within the organic light-emitting display apparatus.

As use of a display apparatus has increased, increasing display quality of the display apparatus is being researched.

SUMMARY

One or more embodiments include a display apparatus driven by a thin film transistor including an oxide semiconductor, where a semiconductor layer of the thin film transistor and a conductive pattern which is under the semiconductor layer may be directly connected to each other via a contact hole in a buffer layer. One or more embodiments include a display apparatus, in which an electrical current transfer caused by partial removal of the semiconductor layer may be improved while maintaining an aperture ratio of a pixel.

However, the above technical features are exemplary, and the scope of the disclosure is not limited thereto.

Additional features will be set forth in part in the description which follows and, in part, will be apparent from the description, or may be learned by practice of the presented embodiments of the disclosure.

According to one or more embodiments, a display apparatus includes a first thin film transistor facing the substrate with the buffer layer therebetween, the first thin film transistor including: a first semiconductor layer including an oxide semiconductor material, a first channel region, a first source region and a first drain region, and a first gate electrode facing the buffer layer with the first semiconductor layer therebetween; a conductive pattern which is between the substrate and the first semiconductor layer and connected to the first semiconductor layer, the conductive pattern facing the first semiconductor layer with the buffer layer therebetween; a first contact hole in the buffer layer and exposing the conductive pattern to outside the buffer layer; and a display element which is electrically connected to the first thin film transistor and emits light. The first source region or the first drain region of the first semiconductor layer extends through the first contact hole in the buffer layer, to contact the conductive pattern and connect the first semiconductor layer to the conductive pattern.

The conductive pattern may overlap the first channel region.

The display apparatus may further include an insulating layer on the first gate electrode, and a second contact hole in the insulating layer and exposing the first semiconductor layer, where the display element may be connected to the first semiconductor layer via the second contact hole.

The display apparatus may further include a gate insulating pattern between the first semiconductor layer and the first gate electrode, where upper surfaces of the first source region and the first drain region, and side surfaces of the gate insulating pattern and the first gate electrode, may each be in direct contact with the insulating layer.

The first semiconductor layer may include an N-type semiconductor.

The display element may be connected to the first drain region and the conductive pattern may be connected to the first source region.

The conductive pattern may have a discrete shape along the substrate.

The display apparatus may further include a data line in a same layer as the conductive pattern, and a second thin film transistor in a same layer as the first semiconductor layer, the second thin film transistor including a second semiconductor layer partially overlapping the data line and a second gate electrode partially overlapping the second semiconductor layer, a third contact hole may be in the buffer layer and exposing the data line, and the second semiconductor layer may partially extend through the third contact hole to be connected to the data line.

The first thin film transistor may be a driving thin film transistor and the second thin film transistor may be a switching thin film transistor.

The second semiconductor layer may include an oxide semiconductor material.

The display apparatus may further include a gate insulating pattern between the first semiconductor layer and the first gate electrode, where the gate insulating pattern may expose the first source region and the first drain region.

Side surfaces of the gate insulating pattern and side surfaces of the first gate electrode may be coplanar.

The second semiconductor layer may include a second channel region, a second source region and a second drain region, and the data line may be connected to one of the second source region and the second drain region.

The second semiconductor layer may include an N-type semiconductor.

The data line may be connected to the second source region.

The first gate electrode may extend from the first thin film transistor to be connected to the second drain region of the second thin film transistor.

The display apparatus may further include an insulating layer covering the first gate electrode and the second gate electrode, and an electrode pattern on the insulating layer, where the electrode pattern may be connected to the first gate electrode and the second drain region.

The display element may include a pixel electrode on the insulating layer, an intermediate layer on the pixel electrode, and an opposite electrode on the intermediate layer, where the electrode pattern may be in a same layer as the pixel electrode.

The display apparatus may further include a storage capacitor on the substrate, the storage capacitor including a lower electrode and an upper electrode overlapping each other, and a driving voltage line to which a first voltage is applied, where the storage capacitor may store a voltage corresponding to a difference between the first voltage applied to the driving voltage line and a second voltage applied to the second thin film transistor.

The lower electrode may be in a same layer as the first gate electrode and the second gate electrode, and the upper electrode may be in a same layer as the electrode pattern.

Other features and advantages of the disclosure will become better understood through the accompanying drawings, the claims and the detailed description.

BRIEF DESCRIPTION OF THE DRAWINGS

The above and other features, and advantages of the disclosure will be more apparent from the following description taken in conjunction with the accompanying drawings, in which.

DETAILED DESCRIPTION

Figure 1:
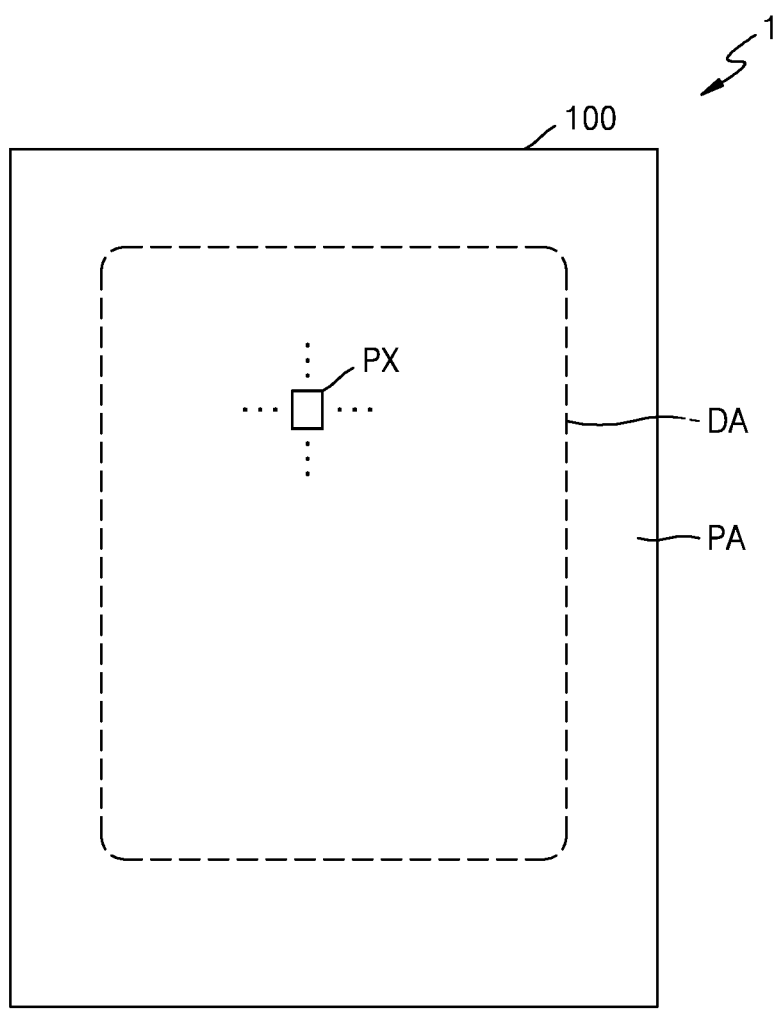
FIG. 1 is a top plan view of an embodiment of a display apparatus.

Reference will now be made in detail to embodiments, examples of which are illustrated in the accompanying drawings, where like reference numerals refer to like elements throughout. In this regard, the embodiments may have different forms and should not be construed as being limited to the descriptions set forth herein. Accordingly, the embodiments are merely described below, by referring to the figures, to explain features of the present description.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As the present disclosure allows for various changes and numerous embodiments, particular embodiments will be illustrated in the drawings and described in detail in the written description. The attached drawings for illustrating one or more embodiments are referred to in order to gain a sufficient understanding, the merits thereof, and the objectives accomplished by the implementation. However, the embodiments may have different forms and should not be construed as being limited to the descriptions set forth herein.

The embodiments will be described below in more detail with reference to the accompanying drawings. Those components that are the same or are in correspondence are rendered the same reference numeral regardless of the figure number, and redundant explanations are omitted.

While such terms as "first," "second," etc., may be used to describe various components, such components are not be limited to the above terms. The above terms are used only to distinguish one component from another.

An expression used in the singular encompasses the expression of the plural, unless it has a clearly different meaning in the context.

In the present specification, it is to be understood that the terms "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Sizes of components in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the specification, the phrase "A and/or B" denotes A, B, or A and B. In addition, the phrase "at least one of A and B" denotes A, B, or A and B.

In the embodiments below, when layers, areas, or elements or the like are referred to as being related such as being "connected," it will be understood that they may be directly connected or an intervening portion may be present between layers, areas or elements. For example, when layers, areas, or elements or the like are referred to as being "electrically connected," they may be directly electrically connected, or layers, areas or elements may be indirectly electrically connected and an intervening portion may be present. In contrast, when layers, areas, or elements or the like are referred to as being related such as being "directly connected," it will be understood that no intervening portion is present between layers, areas or elements.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another (e.g., cross each other, intersect one another, etc.).

Hereinafter, one or more embodiments of the disclosure will be described in detail with reference to accompanying drawings.

FIG. 1 is a top plan view of an embodiment of a display apparatus 1.

Referring to FIG. 1, the display apparatus 1 includes a display area DA for displaying images and a peripheral area PA which is adjacent to the display area DA. The display apparatus 1 may provide images to outside thereof, by using light generated and/or emitted from the display area DA. The peripheral area PA may extend around the display area DA, such as to surround the display area DA in the top plan view, without being limited thereto. Various components, layers, etc. of the display apparatus 1 may include a display area DA and a peripheral area PA corresponding to those described above for the display apparatus 1.

The display apparatus 1 may include a substrate 100 on which various layers are provided. The substrate 100 may include various materials such as glass, metal, plastic, etc. In an embodiment, the substrate 100 may include a flexible material. Here, the substrate 100 including the flexible material denotes a substrate 100 that may be deformable, bendable, foldable, or rollable. The substrate 100 including the flexible material may include ultra-thin glass, metal, or plastic.

A pixel PX may be provided in plurality (e.g., plurality of pixels PX) in the display area DA. The pixel PX may include display elements such as an organic light-emitting diode OLED in the display area DA of the substrate 100. The plurality of pixels PX may be arranged variously within the display area DA, such as a stripe arrangement, a Pentile arrangement, mosaic arrangement, etc., to display one or more images.

When the display area DA is seen in a top plan view, the planar shape of the display area DA may have a rectangular shape as shown in FIG. 1. In another embodiment, the display area DA may have a polygonal shape such as a triangular shape, a pentagonal shape, a hexagonal shape, etc., a circular shape, an elliptical shape, an irregular shape, etc.

The peripheral area PA of the substrate 100 is adjacent to the display area DA, and may not display images (e.g., non-display area). Various conductive wires or signal wires for transferring electrical signals to be applied to the display area DA, a printed circuit board PCB, terminals or pads to which a driver integrated circuit ("IC") chip is attached, and the like may be located in the peripheral area PA.

Figure 2:
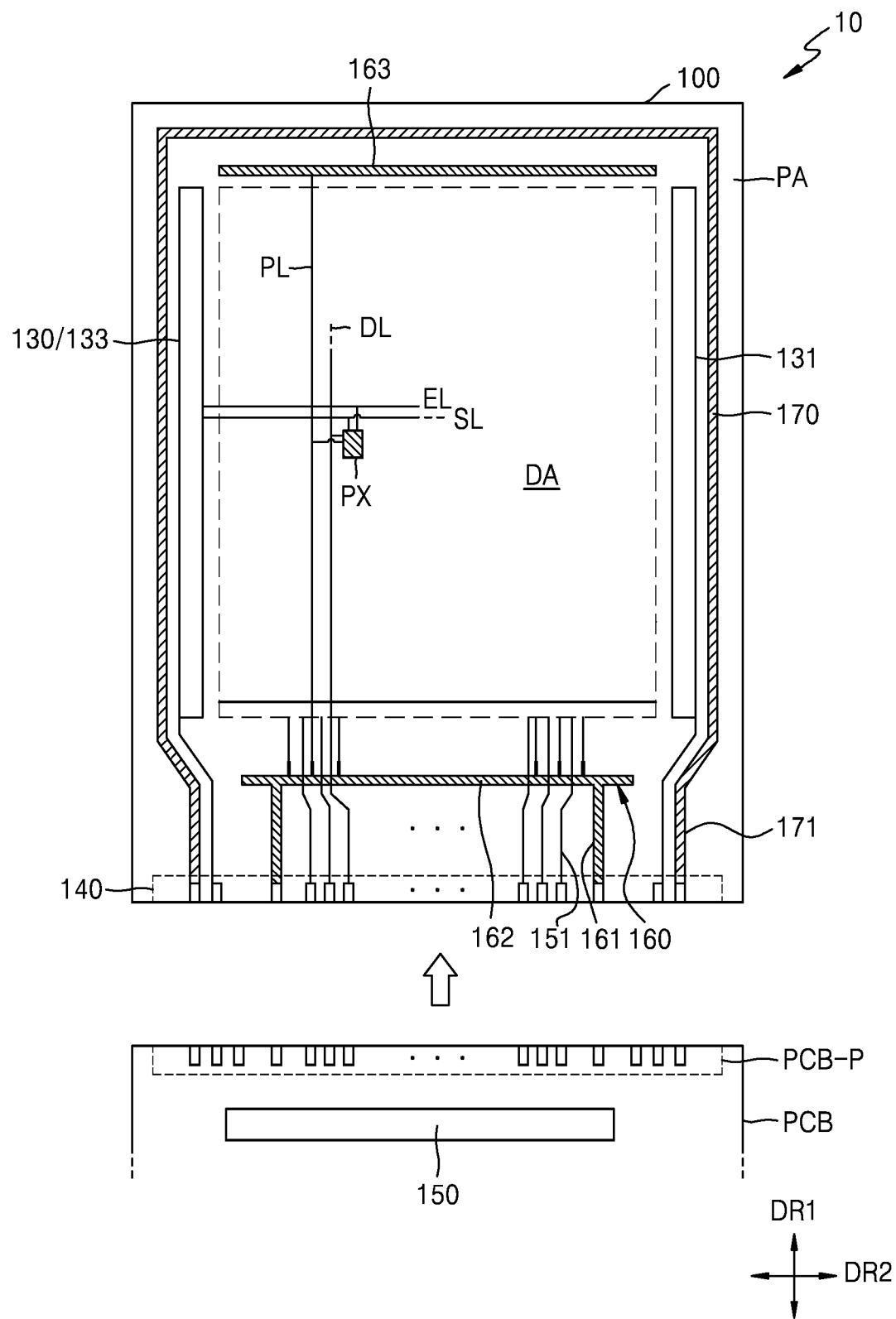
FIG. 2 is a top plan view of an embodiment of a display panel.

FIG. 2 is a top plan view of an embodiment of a display panel 10.

Referring to FIG. 2, the display panel 10 includes the display area DA and the peripheral area PA, and the plurality of pixels PX in the display area DA. Each of the plurality of pixels PX may include a display element such as an organic light-emitting diode OLED. Each of the pixels PX may generate and/or emit light, e.g., red light, green light, blue light or white light, from the organic light-emitting diode OLED. In the specification, each pixel PX may denote a sub-pixel generated and/or emitting light of a different color from another sub-pixel. Each pixel PX may be one of, for example, a red (R) sub-pixel, a green (G) sub-pixel, and a blue (B) sub-pixel. The display area DA is covered by an encapsulation member (not shown) so as to be protected against external air or moisture.

Each of the pixels PX may be electrically connected to an external circuit in the peripheral area PA. A first scan driving circuit 130, a second scan driving circuit 131, an emission control driving circuit 133, a first terminal area 140, a data driving circuit 150, a first power supply line 160, and a second power supply line 170 may be in the peripheral area PA.

The first scan driving circuit 130 and the second scan driving circuit 131 may provide each pixel PX with a scan signal Sn as an electrical signal, via a scan line SL as a signal line. The second scan driving circuit 131 may be arranged in parallel with the first scan driving circuit 130, with the display area DA therebetween. A portion of the pixels PX arranged in the display area DA may be electrically connected to the first scan driving circuit 130, and the other pixels PX may be connected to the second scan driving circuit 131. In another embodiment, the second scan driving circuit 131 may be omitted.

The emission control driving circuit 133 may provide each pixel PX with an emission control signal as an electrical signal, via an emission control line EL as a signal line.

The first terminal area 140 may be at a side of the substrate 100. The first terminal area 140 may be adjacent to an outer edge of the substrate 100. The first terminal area 140 may not be covered by an insulating material layer, to be exposed to outside the display panel 10. The display panel 10 may be electrically connected to an external element such as a printed circuit board PCB, at the first terminal area 140. A second terminal area PCB-P of the printed circuit board PCB may be electrically connected to the first terminal area 140 of the display panel 10. That is, the printed circuit board PCB may be connected to the display panel 10, at the second terminal area PCB-P. The printed circuit board PCB transfers a signal or power from a controller (not shown) outside of the display panel 10, to the display panel 10.

A control signal as an electrical signal generated by the controller may be respectively transferred to the first and second scan driving circuits 130 and 131 via the printed circuit board PCB. The controller may provide the first and second power supply lines 160 and 170 respectively with a first power voltage ELVDD and a second power voltage ELVSS as electrical signals (see FIG. 3 that will be described later), via a first connecting line 161 and a second connecting line 171. The first power voltage ELVDD is provided to each pixel PX via a driving voltage line PL as a signal line connected to the first power supply line 160 and extending along a first direction DR1, and the second power voltage ELVSS may be provided to an opposite electrode 230 (see FIG. 4) of each pixel PX, which is connected to the second power supply line 170.

The data driving circuit 150 is electrically connected to a data line DL as a signal line extending along the first direction DR1. A data signal Dm as an electrical signal of the data driving circuit 150 may be provided to each of the pixels PX via a third connecting line 151 connected to the first terminal area 140, and the data line DL which is connected to the third connecting line 151. Although FIG. 2 shows that the data driving circuit 150 is arranged on the printed circuit board PCB, the data driving circuit 150 may be on the substrate 100. In an embodiment, for example, the data driving circuit 150 may be in the peripheral area PA and between the first terminal area 140 and the first power supply line 160.

The first power supply line 160 may include a first sub-line 162 and a second sub-line 163 that extend in parallel with each other along a second direction DR2 with the display area DA therebetween. The second power supply line 170 has a loop shape having an open side and may partially surround the display area DA. The loop shape of the second power supply line 170 may be open at a same side of the display panel 10 at which the first terminal area 140 is provided.

Figure 3:
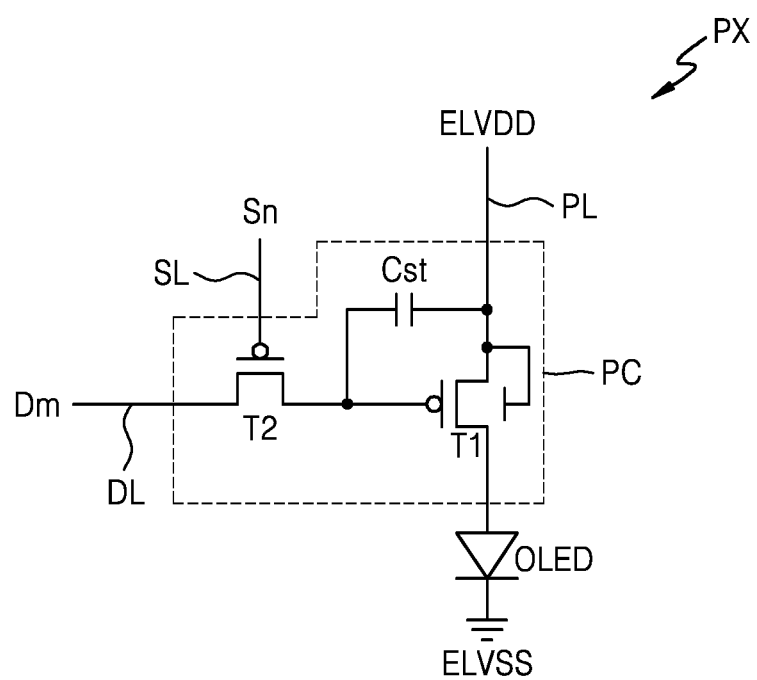
FIG. 3 is an equivalent circuit diagram of an embodiment of a pixel in a display apparatus.

FIG. 3 is an equivalent circuit diagram of an embodiment of a pixel PX in the display apparatus 1.

Referring to FIG. 3, each one of the pixel PX includes a pixel circuit PC connected to a signal line, such as corresponding ones of the scan line SL and the data line DL, and a display element such as the organic light-emitting diode OLED which is connected to the pixel circuit PC.

The pixel circuit PC includes a first thin film transistor T1, a second thin film transistor T2, and a storage capacitor Cst. The second thin film transistor T2 is a switching thin film transistor connected to the scan line SL and the data line DL, and transfers to the first thin film transistor T1, that is, a driving thin film transistor, a data signal Dm input through the data line DL according to the scan signal Sn input through the scan line SL.

The storage capacitor Cst is connected to the second thin film transistor T2 and the driving voltage line PL, and may store a voltage as an electrical signal corresponding to a difference between the first power voltage ELVDD applied to the driving voltage line PL and a voltage applied to the second thin film transistor T2.

The first thin film transistor T1 is connected to the driving voltage line PL and the storage capacitor Cst and may control an electrical driving current flowing from the driving voltage line PL to the display element such as the organic light-emitting diode OLED in response to the voltage value stored in the storage capacitor Cst. The display element such as the organic light-emitting diode OLED may generate and emit light having a certain luminance according to the electrical driving current.

FIG. 3 shows an example in which the pixel circuit PC includes two thin film transistors and one storage capacitor, but one or more embodiments are not limited thereto. In an embodiment, for example, the pixel circuit PC may include three or more thin film transistors and/or two or more storage capacitors. In another embodiment, the pixel circuit PC may include seven thin film transistors and one storage capacitor.

Figure 4:
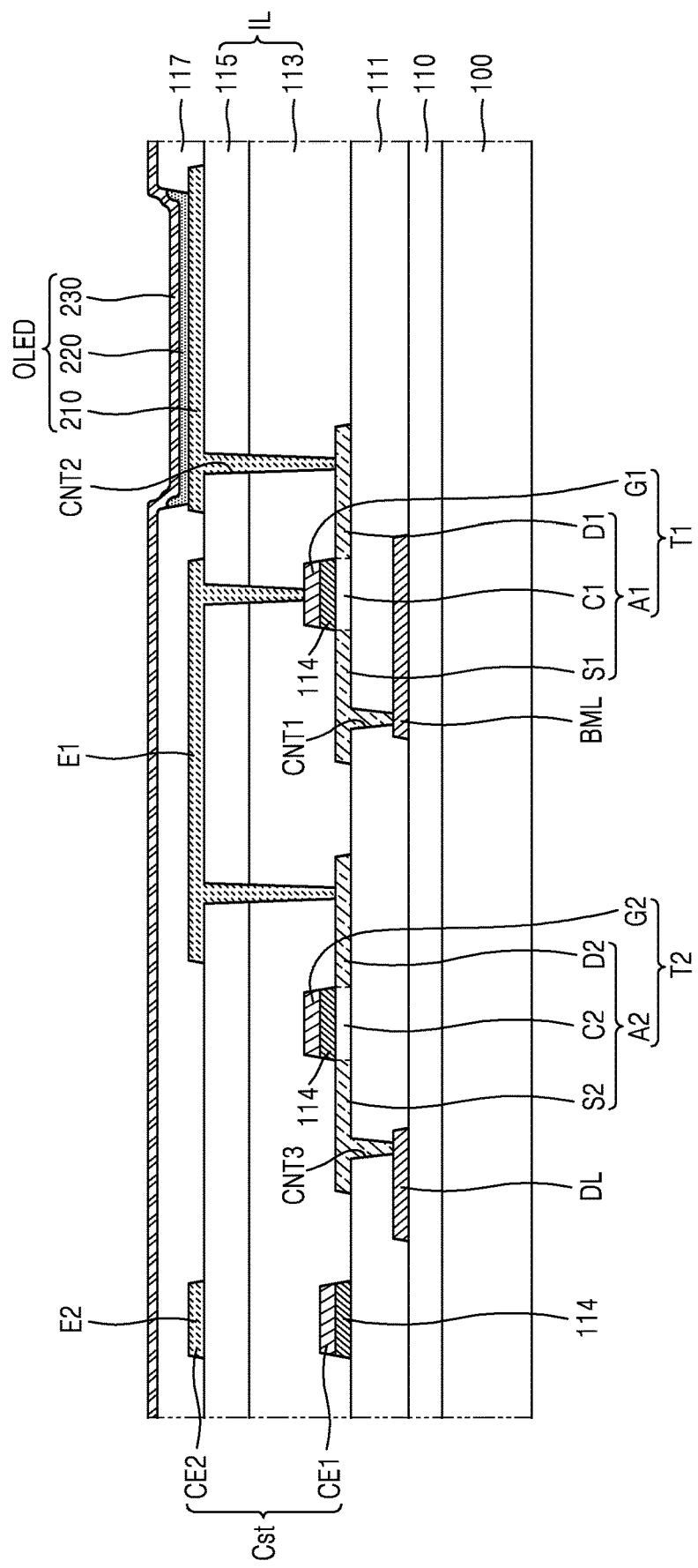
FIG. 4 is a cross-sectional view of an embodiment of the display apparatus.

FIG. 4 is a cross-sectional view of an embodiment of the display apparatus 1. In detail, FIG. 4 shows a cross-sectional view of one of the pixels PX shown in FIG. 3.

The display apparatus 1, the display panel 10 and various components, layers or patterns thereof may be disposed in a plane defined by the first direction DR1 and the second direction DR2 crossing each other. A thickness of the display apparatus 1, the display panel 10 and various components, layers or patterns thereof may be defined along a third direction crossing each of the first direction DR1 and the second direction DR2. Referring to FIG. 4, for example, the vertical direction may represent a thickness direction, while the horizontal direction may variously represent the first direction DR1 and the second direction DR2.

In the display apparatus 1 (see FIG. 1) according to the embodiment, a conductive layer BML (e.g., conductive pattern) is on the substrate 100. A buffer layer 111 is on the conductive layer BML and a first contact hole CNT1 may be defined in the buffer layer 111 to partially expose the conductive layer BML to outside the buffer layer 111. A first semiconductor layer A1 (e.g., first semiconductor pattern) is on the buffer layer 111. The first semiconductor layer A1 may be partially embedded in the first contact hole CNT1 to be connected to the conductive layer BML at the first contact hole CNT1. That is, the first semiconductor layer A1 may be at least partially extended along a thickness direction and connected to the conductive layer BML via the first contact hole CNT1.

Hereinafter, elements included in the display apparatus 1 will be described in detail according to a stacked structure with reference to FIG. 4.

The substrate 100 may include a glass material, a ceramic material, a metal material, or a flexible or bendable material. When the substrate 100 is flexible or bendable, the substrate 100 may include a polymer resin such as a polyethersulfone, polyacrylate, polyetherimide, polyethylene naphthalate, polyethylene terephthalate, polyphynylene sulfide, polyarylate, polyimide, polycarbonate, or cellulose acetate propionate.

The substrate 100 may have a single-layered structure or a multi-layered structure including one or more of the above materials, and the multi-layered structure may further include an inorganic layer. In embodiments, the substrate 100 may have a structure along the thickness direction as including a stacked structure of an organic material/inorganic material/organic material.

A barrier layer 110 may be further provided between the substrate 100 and the buffer layer 111. The barrier layer 110 may prevent or reduce infiltration of impurities from the substrate 100, etc. into the semiconductor layer A1 or a second semiconductor layer A2 (e.g., second semiconductor pattern). The barrier layer 110 may include an inorganic material such as an oxide material or a nitride material, an organic material, or a combination inorganic-organic material. The barrier layer 110 may have a single-layered or multi-layered structure including the inorganic material and the organic material.

The first and second semiconductor layers A1 and A2 may be on the buffer layer 111. The first and second semiconductor layers A1 and A2 may collectively form a semiconductor layer. The first and second semiconductor layers A1 and A2 may include an oxide semiconductor material. The first and second semiconductor layers A1 and A2 may each include, for example, an oxide of at least one selected from indium (In), gallium (Ga), stannum (Sn), zirconium (Zr), vanadium (V), hafnium (Hf), cadmium (Cd), germanium (Ge), chrome (Cr), titanium (Ti), aluminum (Al), cesium (Cs), cerium (Ce), and zinc (Zn).

In an embodiment, for example, the first and second semiconductor layers A1 and A2 may each include an ITZO (InSnZnO) semiconductor layer, an IGZO (InGaZnO) semiconductor layer, etc. Since the oxide semiconductor has a relatively large band gap (about 3.1 electron volts (eV)), a relatively high carrier mobility and a relatively low leakage current, a relatively large drop in voltage does not occur even when a driving time duration of the display apparatus 1 is relatively long. Accordingly, a variation in luminance of the display apparatus 1 according to the voltage drop may be minimal even in a relatively low frequency driving operation.

The first semiconductor layer A1 may include a first channel region C1, and a first source region S1 and a first drain region D1 at opposite sides of the first channel region C1. The second semiconductor layer A2 may include a second channel region C2, and a second source region S2 and a second drain region D2 at opposite sides of the second channel region C2. Each of the first semiconductor layer A1 and the second semiconductor layer A2 may have a single-layered or multi-layered structure.

The conductive layer BML and the data line DL may each be between the barrier layer 110 and the buffer layer 111, along a thickness direction of the substrate 100. The conductive pattern (e.g., conductive layer BML) faces the first channel region C1 with the buffer layer 111 therebetween. The conductive layer BML and the data line DL may each include a conductive material including molybdenum (Mo), aluminum (Al), copper (Cu), titanium (Ti), etc., and may have a single-layered or multi-layered structure including one or more of the above materials. In an embodiment, for example, the conductive layer BML and the data line DL may each have a multi-layered structure including Ti/Al/Ti.

The conductive layer BML may overlap the first semiconductor layer A1 including an oxide semiconductor material. As used herein, overlap may also refer to an element corresponding to another element in position or location. Since the first semiconductor layer A1 including the oxide semiconductor material is vulnerable to light, the conductive layer BML may reduce or effectively prevent a photocurrent from occurring in the first semiconductor layer A1 due to external light incident from the substrate 100 and may also reduce or effectively prevent device characteristics of the first thin film transistor T1 including the oxide semiconductor material from being changed.

The conductive layer BML may correspond to the first channel region C1 of the first thin film transistor T1, and may be of an isolated type. As being isolated, an element may be a discrete pattern or an island shape extended along the substrate 100.

In an embodiment, portions of the buffer layer 111 may define the first contact hole CNT1 and a third contact hole CNT3 that partially expose the conductive layer BML and the data line DL, respectively. The first semiconductor layer A1 extends along the thickness direction to be connected to the conductive layer BML at or via the first contact hole CNT1. Also, the second semiconductor layer A2 may be extended along the thickness direction to be connected to the data line DL at or via the third contact hole CNT3.

In an embodiment, the conductive layer BML may be connected to the first source region S1 and/or the first drain region D1, and the data line DL may be connected to the second source region S2 and/or the second drain region D2. In an embodiment, for example, when the first and second semiconductor layers A1 and A2 include an n-type semiconductor, the conductive layer BML may be connected to the first source region S1 of the first semiconductor layer A1 and the data line DL may be connected to the second source region S2 of the second semiconductor layer A2.

A gate insulating layer 114 (e.g., gate insulating pattern) may be on the first and second semiconductor layers A1 and A2. The gate insulating layer 114 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

In an embodiment, the gate insulating layer 114 may be a portion of a gate insulating material layer which is patterned to partially overlap the first and second semiconductor layers A1 and A2, as shown in FIG. 4. That is, in an embodiment of manufacturing the display apparatus 1, the gate insulating material layer may be patterned to define gate insulating patterns which expose the first and second source regions S1 and S2 and the first and second drain regions D1 and D2 outside of the gate insulating layer 114.

A first gate electrode G1 and a second gate electrode G2 may face the first semiconductor layer A1 and the second semiconductor layer A2, respectively, with the gate insulating layer 114 therebetween. The gate insulating patterns define sidewalls or side surfaces of the gate insulating layer 114. In an embodiment of a method of manufacturing the display apparatus 1, side surfaces of the gate insulating layer 114, and side surfaces of the first gate electrode G1 and the second gate electrode G2 which respectively correspond to each other, may be obtained by etching along a same surface. That is, the side surfaces of the gate insulating layer 114, and the side surfaces of the first gate electrode G1 and the second gate electrode G2 which correspond to each other, may be coplanar with each other. The first source region S1 and the first drain region D1 of the first semiconductor layer A1 extend further than the side surfaces of the gate insulating pattern.

Overlapping regions between the gate insulating layer 114 and the first semiconductor layer A1, and between the gate insulating layer 114 and the second semiconductor layer A2, may be understood as the first and second channel regions C1 and C2, respectively. In an embodiment of a method of manufacturing the display apparatus 1, a semiconductor material layer for forming the first and second source regions S1 and S2 and the first and second drain regions D1 and D2 undergoes a process to be conductive such as by a plasma treatment. Portions of such semiconductor material layer at overlapped by the gate insulating layer 114 (that is, the first and second channel regions C1 and C2) are not exposed to the plasma treatment and may have different characteristics (e.g., electrical, mechanical, etc.) from those of the first and second source regions S1 and S2 and the first and second drain regions D1 and D2. That is, during the plasma treatment of the semiconductor material layer for providing the first and second semiconductor layers A1 and A2, the first and second gate electrodes G1 and G2 on the gate insulating layer 114 are used as a self-alignment mask to provide or form the first and second channel regions C1 and C2 that are not plasma treated at the locations overlapping the gate insulating layer 114. In addition, the first and second source regions S1 and S2 and the first and second drain regions D1 and D2 as plasma-treated portions of the semiconductor material layer may be at opposite sides of the first and second channel regions C1 and C2, respectively.

In another embodiment, the gate insulating layer 114 may not be patterned to partially overlap the first and second semiconductor layers A1 and A2, but may cover the first and second semiconductor layers A1 and A2. That is, the gate insulating layer 114 may correspond to an entirety of the first and second semiconductor layers A1 and A2.

The first and second gate electrodes G1 and G2 may be on the gate insulating layer 114 and may at least partially overlap the first and second semiconductor layers A1 and A2. That is, the first and second gate electrodes G1 and G2 may face the first and second semiconductor layers A1 and A2, respectively, with the gate insulating layer 114 therebetween. The first and second gate electrodes G1 and G2 may each have a single-layer structure or multi-layered structure including one or more metal selected from aluminum (Al), platinum (Pt), palladium (Pd), argentum (Ag), magnesium (Mg), aurum (Au), nickel (Ni), neodymium (Nd), iridium (Ir), chromium (Cr), lithium (Li), calcium (Ca), molybdenum (Mo), titanium (Ti), tungsten (W), and copper (Cu).

In an embodiment, the storage capacitor Cst may include a lower electrode CE1 and an upper electrode CE2. As shown in FIG. 4, the lower electrode CE1 of the storage capacitor Cst may include a same material as that of the first and second gate electrodes G1 and G2 in the first and second thin film transistors T1 and T2, respectively. The lower electrode CE1 of the storage capacitor Cst may be in a same layer as that of the first and second gate electrodes G1 and G2. As being in a same layer, features may be respective portions of a same material layer on the substrate 100. In an embodiment of a method of manufacturing the display apparatus 1, the features in a same layer as each other may be provided from a same material layer, in a same process, simultaneously with each other, etc. to define respective portions of the same material layer.

In another embodiment, the first gate electrode G1 of the first thin film transistor T1 may act as the lower electrode CE1 of the storage capacitor Cst.

In an embodiment, the first thin film transistor T1 including the first semiconductor layer A1 and the first gate electrode G1 may act as the driving thin film transistor, and the second thin film transistor T2 including the second semiconductor layer A2 and the second gate electrode G2 may act as the switching thin film transistor.

An interlayer insulating layer 113 may be provided to cover the first semiconductor layer A11, the second semiconductor layer A2, the first and second gate electrodes G1 and G2, and the lower electrode CE1 of the storage capacitor Cst. The interlayer insulating layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

Referring to FIG. 4, upper surfaces of the first and second source regions S1 and S2 and upper surfaces of the first and second drain regions D1 and D2 are furthest from the substrate 100. In an embodiment, the upper surfaces of the first and second source regions S1 and S2 and the upper surfaces of the first and second drain regions D1 and D2 may be in direct contact with the interlayer insulating layer 113.

Also, side surfaces of the gate insulating layer 114 and the first and second gate electrodes G1 and G2 may be in direct contact with the interlayer insulating layer 113. As being in direct contact, elements may form an interface with each other at respective contacting surfaces.

A planarization layer 115 is on the interlayer insulating layer 113, and the display element such as the organic light-emitting diode OLED may be on the planarization layer 115.

The planarization layer 115 may include a single-layered structure or multi-layered structure including an organic material, and may provide a planarized upper surface. The planarization layer 115 may include a general universal polymer (benzocyclobutene ("BOB"), polyimide, hexamethyldisiloxane ("HMDSO"), polymethylmethacrylate ("PMMA"), or polystyrene ("PS")), polymer derivatives having phenol groups, acryl-based polymer, imide-based polymer, aryl ether-based polymer, amide-based polymer, fluoride-based polymer, p-xylene-based polymer, vinyl alcohol-based polymer, and combinations thereof.

The display element such as the organic light-emitting diode OLED, a first electrode layer E1 (e.g., electrode pattern or first electrode pattern), and a second electrode layer E2 (e.g., second electrode pattern) are on the planarization layer 115. The display element such as the organic light-emitting diode OLED includes a pixel electrode 210 (e.g., third electrode pattern), an intermediate layer 220, and an opposite electrode 230.

The first electrode layer E1, the second electrode layer E2, and the pixel electrode 210 may be (semi-)transmissive electrodes or reflective electrodes. In embodiments, the pixel electrode 210 may include a reflective layer including Ag, Mg, Al, Pt, Pd, Au, Ni, Nd, Ir, Cr, and a combination thereof, and a transparent or semi-transparent electrode layer on the reflective layer. The transparent or semi-transparent electrode layer may include at least one selected from indium tin oxide ("ITO"), indium zinc oxide ("IZO"), zinc oxide ("ZnO"), indium oxide ($In_2O_3$), indium gallium oxide, and aluminum zinc oxide ("AZO"). In embodiments, the first electrode layer E1, the second electrode layer E2, and the pixel electrode 210 may each include ITO/Ag/ITO. The first electrode layer E1, the second electrode layer E2 and the pixel electrode 210 may be in a same layer as each other.

In an embodiment, the first electrode layer E1 may act as or define a bridge (e.g., bridge electrode) for connecting the first gate electrode G1 of the first thin film transistor T1 to the second drain region D2 of the second thin film transistor T2.

Also, in an embodiment, the second electrode layer E2 may define the upper electrode CE2 of the storage capacitor Cst. That is, the upper electrode CE2 of the storage capacitor Cst overlaps and faces the lower electrode CE1 with the interlayer insulating layer 113 and the planarization layer 115 therebetween, and may form a capacitance. In this case, the interlayer insulating layer 113 and the planarization layer 115 may function as a dielectric layer of the storage capacitor Cst.

The pixel electrode 210 of the display element such as the organic light-emitting diode OLED may be connected to the first semiconductor layer A1 at or via a second contact hole CNT2 that penetrates through an insulating layer IL to partially expose the first semiconductor layer A1. The second contact hole CNT2 in the insulating layer is spaced apart from the first contact hole CNT1 in a direction along the substrate 100. The insulating layer IL may include a collection of insulating material layers, such as the interlayer insulating layer 113 together with the planarization layer 115. In an embodiment, for example, the first semiconductor layer A1 may include an N-type semiconductor, and the pixel electrode 210 may be connected to the first drain region D1.

A pixel defining layer 117 may be on the planarization layer 115. The pixel defining layer 117 increases a distance between an edge of the pixel electrode 210 and the opposite electrode 230 which is on the pixel electrode 210, to reduce or effectively prevent generation of an electrical arc at the edge of the pixel electrode 210. The distance may be defined along the thickness direction of the display apparatus 1. The pixel defining layer 117 may define a light-emitting region at which light is emitted from the display element.

The pixel defining layer 117 may include one or more organic insulating materials selected from polyimide, polyamide, acryl resin, BCB, and phenol resin. The pixel defining layer 117 may be manufactured by a spin coating method, etc.

The intermediate layer 220 of the display element such as the organic light-emitting diode OLED may include an organic light-emitting layer. The organic light-emitting layer may include an organic material including a fluorescent or phosphor material generating and/or emitting red, green, blue, or white light. The organic light-emitting layer may include a relatively low-molecular organic material or a polymer organic material, and functional layers such as a hole transport layer ("HTL"), a hole injection layer ("HL"), an electron transport layer ("ETL"), and an electron injection layer ("EIL") may be selectively arranged under and on the organic light-emitting layer. The intermediate layer 220 may include a plurality of patterns which respectively correspond to each of the plurality of pixel electrodes 210 as a pixel electrode pattern. However, one or more embodiments are not limited thereto. The intermediate layer 220 may be variously modified, that is, may be arranged as a common layer corresponding to the plurality of pixel electrodes 210.

The opposite electrode 230 may include a transmissive electrode or a reflective electrode. In embodiments, the opposite electrode 230 may be a transparent or a semitransparent electrode, and may be provided as a metal thin film including Li, Ca, LiF/Ca, LiF/Al, Al, Ag, Mg, and a compound thereof having a small work function. Also, a transparent conductive oxide ("TCO") layer such as ITO, IZO, ZnO, or $In_2O_3$ may be further provided over the metal thin film. The opposite electrode 230 is arranged throughout the display area DA (see FIG. 1), and on the intermediate layer 220 and the pixel defining layer 117. The opposite electrode 230 may be provided integrally with respect to the plurality of display elements such as the organic light-emitting diode OLED to correspond to the plurality of pixel electrodes 210.

A capping layer (not shown) may be on the opposite electrode 230. That is, the capping layer may face the substrate 100 with the opposite electrode 230 therebetween. The capping layer may protect the opposite electrode 230, and may increase a light extracting efficiency. In an embodiment, for example, the capping layer may include a material having a refractive index of about 1.2 to about 3.1. Also, the capping layer may include an organic material. In an embodiment, the capping layer may be omitted.

In the embodiment, the first semiconductor layer A1 may be directly connected to the conductive layer BML via the first contact hole CNT1 extended through a thickness of the buffer layer 111. This will be described in detail with reference to FIG. 4.

As described above, the conductive layer BML may protect the oxide semiconductor that is vulnerable to the light, against the external light introduced through the substrate 100. The conductive layer BML is between the substrate 100 and the first semiconductor layer A1, and corresponds to a position of the first semiconductor layer A1.

In a comparative example, the conductive layer BML may include a conductive material, and the conductive layer BML including the conductive material may be under the semiconductor layer in an electrically floating state without being connected to the semiconductor layer or the gate electrode. In this case, a voltage of the conductive layer BML may be freely changed, for example, may be changed to be the same as that of the gate electrode, and an unexpected result may be obtained when driving the pixel circuit PC.

In the display apparatus 1 according to one or more embodiment, the first contact hole CNT1 that penetrates the buffer layer 111 and partially exposes the conductive layer BML may be provided to connect the conductive layer BML to the first semiconductor layer A1. The first semiconductor layer A1 may be partially embedded in the first contact hole CNT1, and as such, the first semiconductor layer A1 may be connected to the conductive layer BML and the conductive layer BML may be maintained stabilized.

In a comparative example, a bridge may be formed by using a gate metal that is used to form the gate electrode, in order to connect the conductive layer BML to the semiconductor layer. The bridge from the gate metal may be obtained by providing or forming a metal layer throughout the entire substrate and patterning the metal layer. When the patterning is performed, the semiconductor layer may not be protected by a photoresist pattern or a gate insulating layer 114, but may be partially exposed and removed. In addition, due to the partial removal of the semiconductor layer, electrical current may not sufficiently move and driving the pixel circuit PC may be difficult.

In another comparative example, a bridge may be obtained by forming an electrode layer (e.g., connecting member or connecting layer) in a same layer as the pixel electrode 210 in order to connect the conductive layer BML to the semiconductor layer. When the bridge is obtained by providing or forming the electrode layer in a same layer as the pixel electrode 210, a planar area of the pixel electrode 210 per unit pixel may be reduced, and an aperture area corresponding to a planar area of a light-emitting region may be reduced. That is, the aperture ratio of the display apparatus 1 may be reduced.

However, like in one or more embodiment, when the first semiconductor layer Al is connected to the conductive layer BML via the first contact hole CNT1, the bridge of the comparative examples is obviated, and material layers providing the first gate electrode G1 and the gate insulating layer 114 may be patterned together. When the first gate electrode G1 and the gate insulating layer 114 are patterned together, the gate insulating layer 114 protects the first semiconductor layer A1, and the first semiconductor layer A1 may not be partially exposed and removed. Therefore, the electrical current may sufficiently move at a transistor and the pixel circuit PC (see FIG. 3) may be stabilized.

Also, since the electrode layer for connecting the first semiconductor layer A1 to the conductive layer BML is not provided in a same layer as the pixel electrode 210, the planar area of the pixel electrode 210 per unit pixel may be maintained constant. That is, a constant aperture ratio may be maintained.

The conductive layer BML may be connected to the first source region S1 and/or the first drain region D1 of the first semiconductor layer A1. In an embodiment, for example, when the first semiconductor layer A1 includes an N-type semiconductor, the conductive layer BML may be connected to the first source region S1 as shown in FIG. 4.

The data line DL including the conductive material may be in a same layer as that of the conductive layer BML. According to the embodiment, as the conductive layer BML is connected to the first semiconductor layer A1 via the first contact hole CNT1 in the buffer layer 111, the second semiconductor layer A2 may be connected to the data line DL via the third contact hole CNT3 that penetrates through the thickness of the buffer layer 111 and partially exposes the data line DL.

In a comparative example, the semiconductor layer and the data line DL may be connected to each other via the bridge provided or formed from the gate metal or the bridge provided or formed from the electrode layer in a same layer as the pixel electrode 210, as described above. In this case, the semiconductor layer may be partially removed and the aperture ratio may be reduced.

However, in one or more embodiment, when the second semiconductor layer A2 is connected to the data line DL via the third contact hole CNT3 of the buffer layer 111, in which the second semiconductor layer A2 is partially embedded, the second semiconductor layer A2 is not partially exposed and removed, and thus, the pixel circuit PC may be stabilized. Also, since the electrode layer for connecting the second semiconductor layer A2 to the data line DL is not provided or formed in a same layer as the pixel electrode 210, the planar area of the pixel electrode 210 per unit pixel may be maintained constant and a constant aperture ratio may be maintained.

The data line DL may be connected to the second source region S2 and/or the second drain region D2 of the second semiconductor layer A2. In an embodiment, for example, the data line DL may be connected to the second source region S2.

Figure 5:
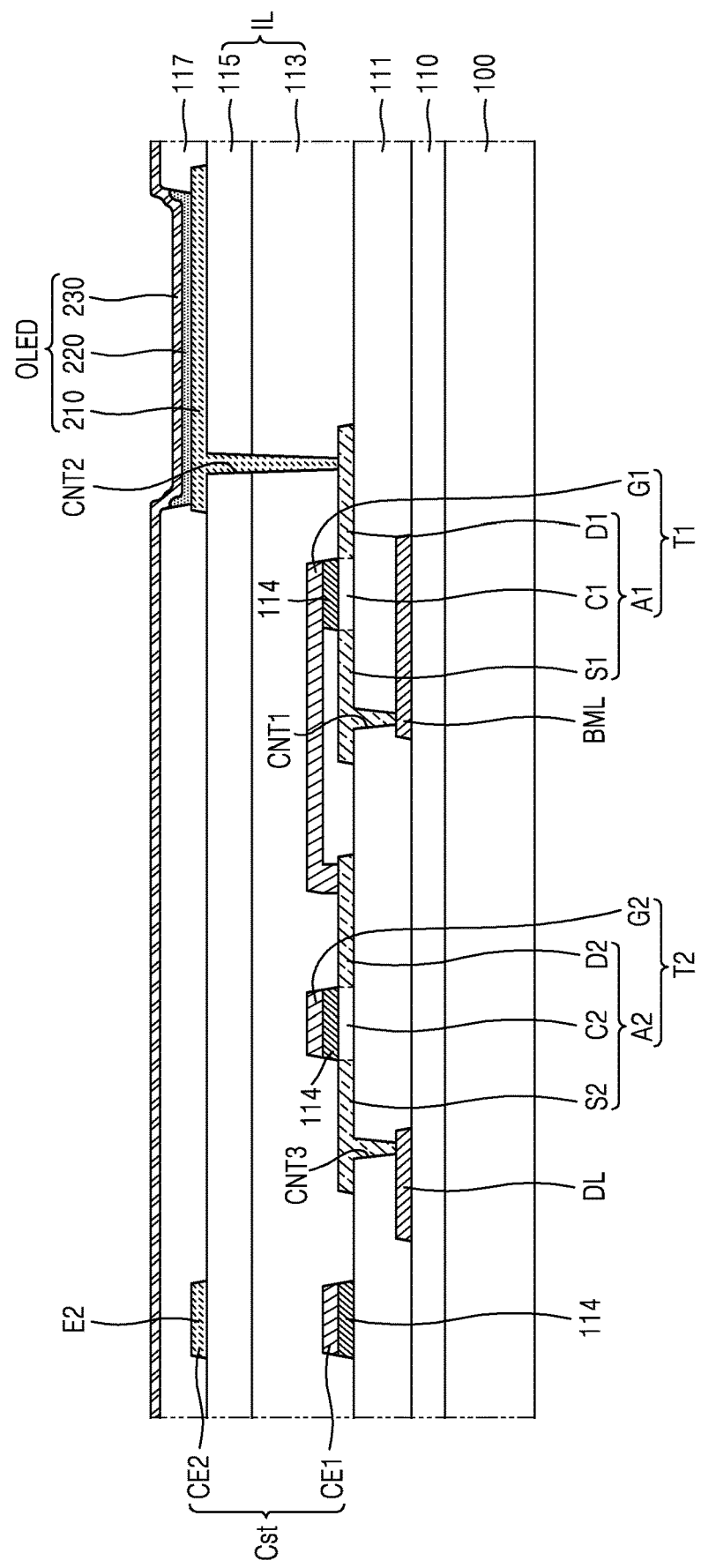
FIG. 5 is a cross-sectional view of an embodiment of the display apparatus.

FIG. 5 is a cross-sectional view of an embodiment of the display apparatus 1. FIG. 5 shows a modified example of the embodiment illustrated with reference to FIG. 4, and thus in FIG. 5, like reference numerals as those of FIG. 4 denote the same members and descriptions thereof are omitted.

Referring to FIG. 5, the barrier layer 110, the buffer layer 111, the conductive layer BML, the data line DL, the first thin film transistor T1, the second thin film transistor T2, the storage capacitor Cst, and the display element such as the organic light-emitting diode OLED are on the substrate 100.

In FIG. 4, the first gate electrode G1 of the first thin film transistor T1 and the second drain region D2 of the second thin film transistor T2 are connected to each other via the first electrode layer E1 in a same layer as that of the pixel electrode 210. However, referring to FIG. 5, the first gate electrode G1 of the first thin film transistor T1 may extend to the second drain region D2 of the second thin film transistor T2 to be directly connected to the second drain region D2. That is, the first gate electrode G1 functions as a bridge between the first thin film transistor T1 and the second thin film transistor T2.

When the first gate electrode G1 extends to be directly connected to the second drain region D2, the first and second electrode layers E1 and E2 are not provided or formed in a same layer as the pixel electrode 210, and thus, the aperture ratio may be maintained constant or increased. That is, the embodiment illustrated with reference to FIG. 4 or FIG. 5 may be selected, and the aperture ratio may be maintained constant or increased.

Embodiments of the display apparatus 1 have been described, but the disclosure is not limited thereto. A method of manufacturing the display apparatus 1 may be also included in the scope of the disclosure.

FIGS. 6A to 6H are cross-sectional views sequentially illustrating an embodiment of a method of manufacturing the display apparatus 1 of FIG. 4. In FIGS. 6A to 6H, like reference numerals as those of FIG. 4 denote the same members, and detailed descriptions thereof are omitted.

Figure 6A:
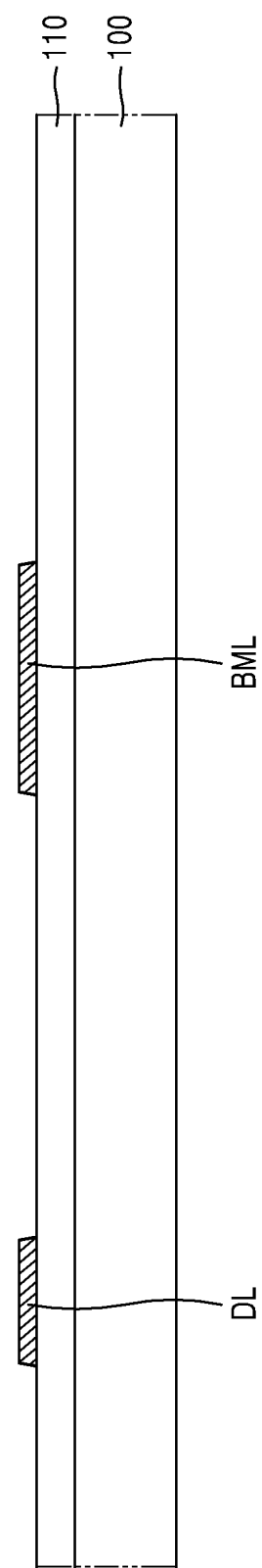
FIGS. 6A to 6H are cross-sectional views illustrating processes in an embodiment of a method of manufacturing a display apparatus.

Referring to FIG. 6A, the barrier layer 110, the conductive layer BML (e.g., a conductive pattern), and the data line DL are provided or formed on the substrate 100.

The conductive layer BML and the data line DL may be provided or formed by patterning a first preliminary-metal layer (not shown). The first preliminary-metal layer may include a conductive material including molybdenum (Mo), aluminum (Al), copper (Cu), titanium (Ti), etc., and may have a single-layered or multi-layered structure. The conductive layer BML and the data line DL are respective patterned portions of the first preliminary-metal layer.

Figure 6B:
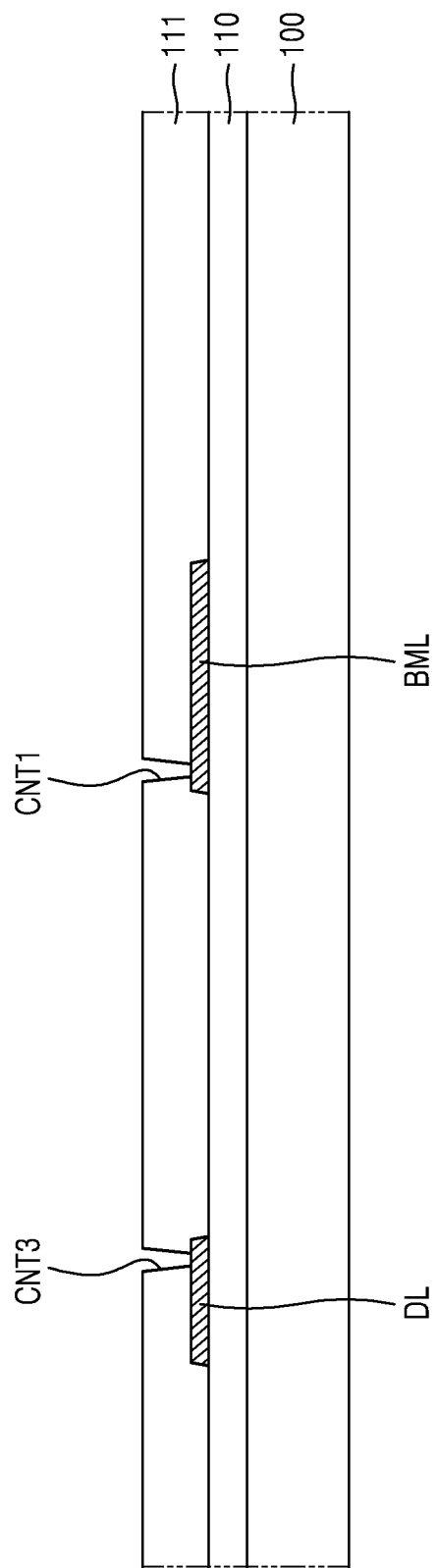

Referring to FIG. 6B, the buffer layer 111 is provided or formed on the conductive layer BML and the data line DL.

The buffer layer 111 may include silicon oxide ($SiO_2$) or silicon nitride ($SiN_x$), and may be manufactured by a deposition method such as chemical vapor deposition ("CVD") method, a sputtering method, etc.

After forming the buffer layer 111, the first contact hole CNT1 and the third contact hole CNT3 that partially expose the conductive layer BML and the data line DL, respectively, are provided or formed in the buffer layer 111. The first contact hole CNT1 corresponds to the first semiconductor layer A1 and the third contact hole CNT3 corresponds to the second semiconductor layer A2.

Figure 6C:
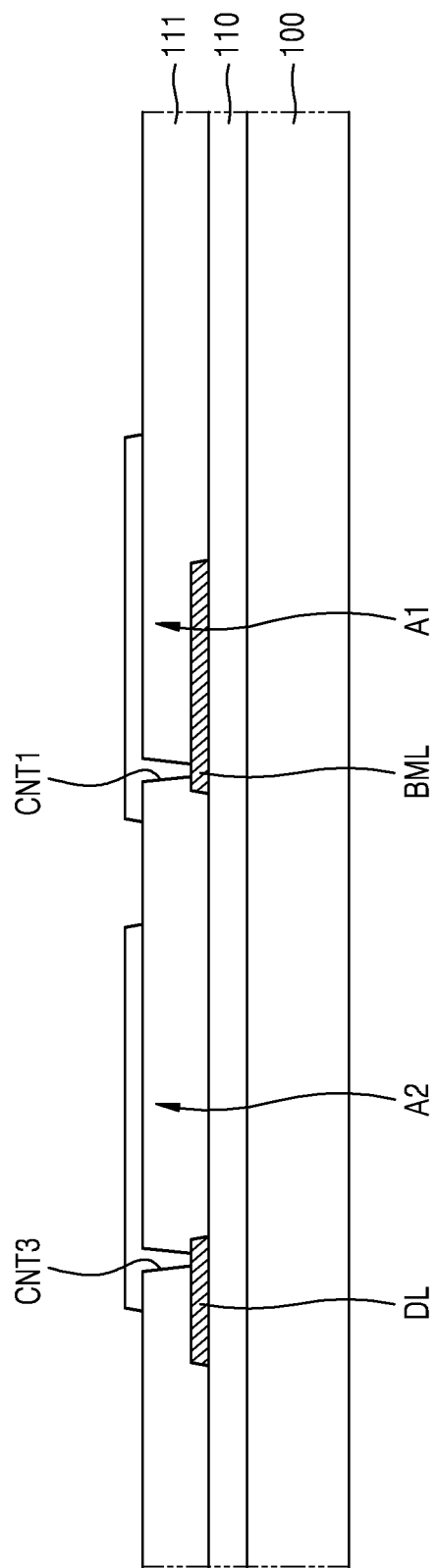

Referring to FIG. 6C, the first and second semiconductor layers A1 and A2 in a preliminary form are provided or formed on the buffer layer 111. The first and second semiconductor layers A1 and A2 in the preliminary form may be provided or formed by patterning a preliminary-semiconductor material layer (not shown). The preliminary-semiconductor material layer may include oxide semiconductor and may be formed by a chemical vapor deposition method.

In an embodiment, the first and second semiconductor layers A1 and A2 in the preliminary form may be partially embedded in the first contact hole CNT1 and the third contact hole CNT3, respectively. As being partially embedded, the first and second semiconductor layers A1 and A2 in the preliminary form extend from outside the buffer layer 111, and into the first contact hole CNT1 and the third contact hole CNT3, respectively. As such, the first and second semiconductor layers A1 and A2 may be respectively connected to the conductive layer BML and the data line DL, at the first contact hole CNT1 and the third contact hole CNT3.

Figure 6D:
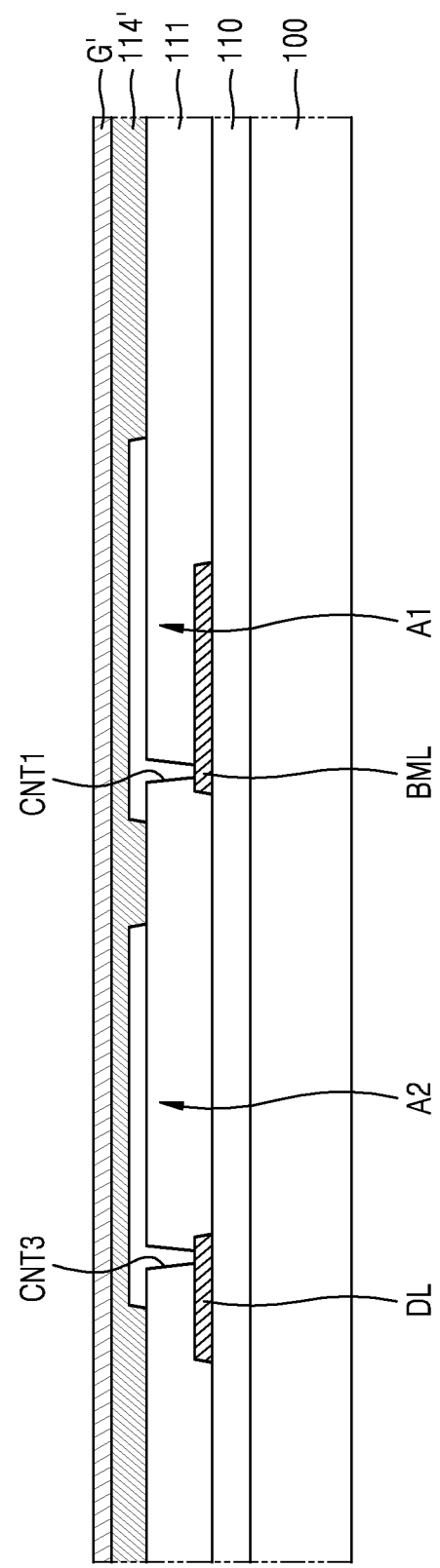

Referring to FIG. 6D, a preliminary gate insulating layer 114' and a second preliminary metal layer G' are sequentially provided or formed on the first and second semiconductor layers A1 and A2. The preliminary gate insulating layer 114' and a second preliminary metal layer G' may be provided along an entirety of the substrate 100 without being limited thereto.

The preliminary gate insulating layer 114' may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The preliminary gate insulating layer 114' may be provided or formed by a deposition method such as the chemical vapor deposition ("CVD") method, the sputtering method, etc., but is not limited thereto.

The second preliminary metal layer G' may have a single-layered or multi-layered structure including one or more metal materials selected from aluminum (Al), platinum (Pt), palladium (Pd), argentum (Ag), magnesium (Mg), aurum (Au), nickel (Ni), neodymium (Nd), iridium (Ir), chromium (Cr), lithium (Li), calcium (Ca), molybdenum (Mo), titanium (Ti), tungsten (W), and copper (Cu). The second preliminary metal layer G' may be provided or formed by, but is not limited to, a chemical vapor deposition method, a plasma enhanced CVD ("PECVD") method, a low pressure CVD ("LPCVD") method, a physical vapor deposition ("PVD") method, a sputtering method, an atomic layer deposition ("ALD") method, etc.

Figure 6E:
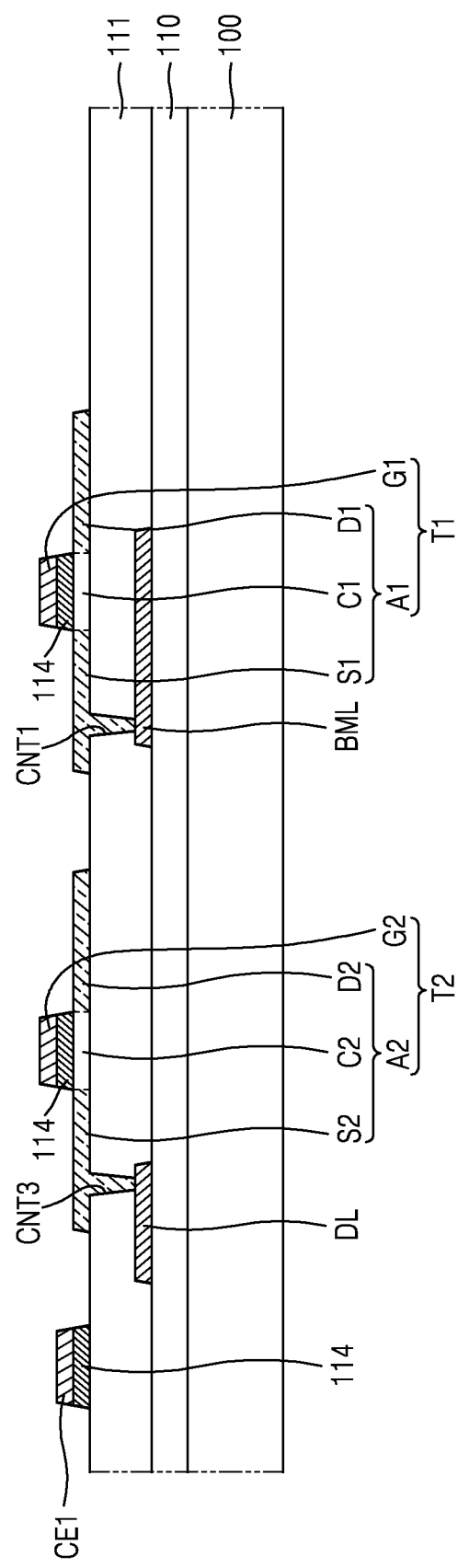

Referring to FIG. 6E, the second preliminary metal layer G' is patterned to provide or form the first gate electrode G1, the second gate electrode G2, and the lower electrode CE1 of the storage capacitor Cst. The first gate electrode G1, the second gate electrode G2 and the lower electrode CE1 are respective patterned portions of the second preliminary metal layer G'.

The gate insulating layer 114 is provided or formed by patterning the preliminary gate insulating layer 114', by using the first gate electrode G1, the second gate electrode G2, and the lower electrode CE1 of the storage capacitor Cst as self-alignment masks. That is, the gate insulating layer 114 may be patterned to partially overlap the first and second semiconductor layers A1 and A2, at gate insulating layer patterns. The gate insulating layer patterns at the first gate electrode G1, the second gate electrode G2, and the lower electrode CE1 are respective patterned portions of the preliminary gate insulating layer 114'.

Patterning of the preliminary gate insulating layer 114', by using the first gate electrode G1, the second gate electrode G2, and the lower electrode CE1 as self-alignment masks, forms side surfaces of the gate insulating layer 114 together with side surfaces of the first gate electrode G1, the second gate electrode G2, and the lower electrode CE1. In an embodiment, the side surface of the gate insulating layer 114 and the side surface of the first gate electrode G1 may be obtained by providing a same etched surface.

In patterning of the second preliminary metal layer G' and the preliminary gate insulating layer 114', end portions of the first and second semiconductor layers A1 and A2 are exposed outside the gate insulating layer 114, the first gate electrode G1 and the second gate electrode G2. A plasma treatment is performed on the exposed portions of the first and second semiconductor layers A1 and A2 to undergo a process to be conductive according to the plasma treatment. The plasma treatment may be performed during the patterning of the preliminary gate insulating layer 114'.

As a result of the plasma treatment, the first and second source regions S1 and S2 and the first and second drain regions D1 and D2 at portions of the first and second semiconductor layers A1 and A2 which are exposed are processed to be conductive. The first and second channel regions C1 and C2 overlapping the first and second gate electrodes G1 and G2, have different characteristics from the first and second source regions S1 and S2 and the first and second drain regions D1 and D2.

In an embodiment, when the first and second semiconductor layers A1 and A2 include the N-type semiconductor, the conductive layer BML may be connected to the first source region S1 of the first semiconductor layer A1, and the data line DL may be connected to the second source region S2 of the second semiconductor layer A2.

Figure 6F:
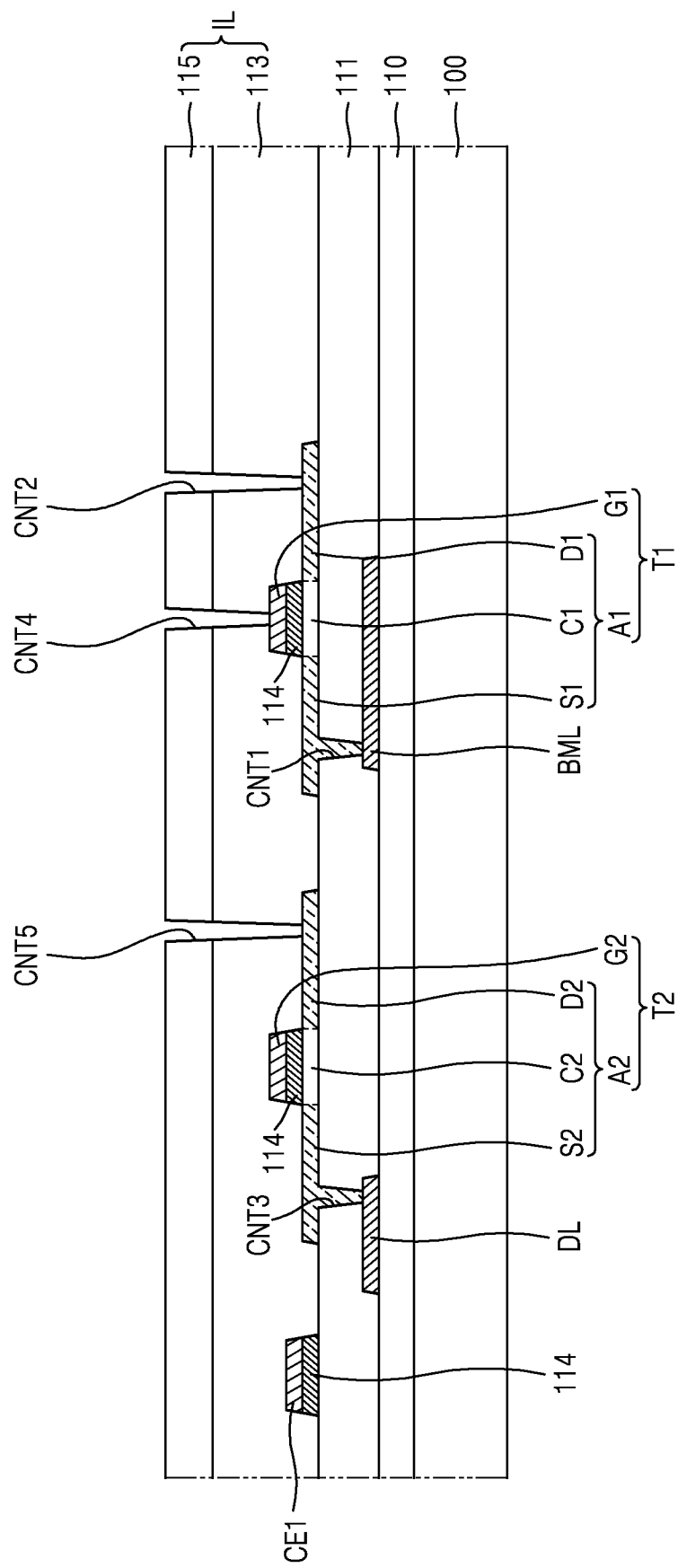

Referring to FIG. 6F, the insulating layer IL such as a collection of the interlayer insulating layer 113, the planarization layer 115, etc., is provided or formed on the first gate electrode G1, the second gate electrode G2, and the lower electrode CE1 of the storage capacitor Cst.

After forming the insulating layer IL, the second contact hole CNT2, a fourth contact hole CNT4, and a fifth contact hole CNT5 respectively penetrating through a thickness of the insulating layer IL and partially exposing the first semiconductor layer A1, the first gate electrode G1, and the second semiconductor layer A2 are provided or formed. The second contact hole CNT2 and the fourth contact hole CNT4 correspond to a same one of the first semiconductor layer A1, while the fifth contact hole CNT5 corresponds to the second semiconductor layer A2. The fourth contact hole CNT4 and the fifth contact hole CNT5 correspond to a same bridge pattern, that is, the first electrode layer E1.

Figure 6G:
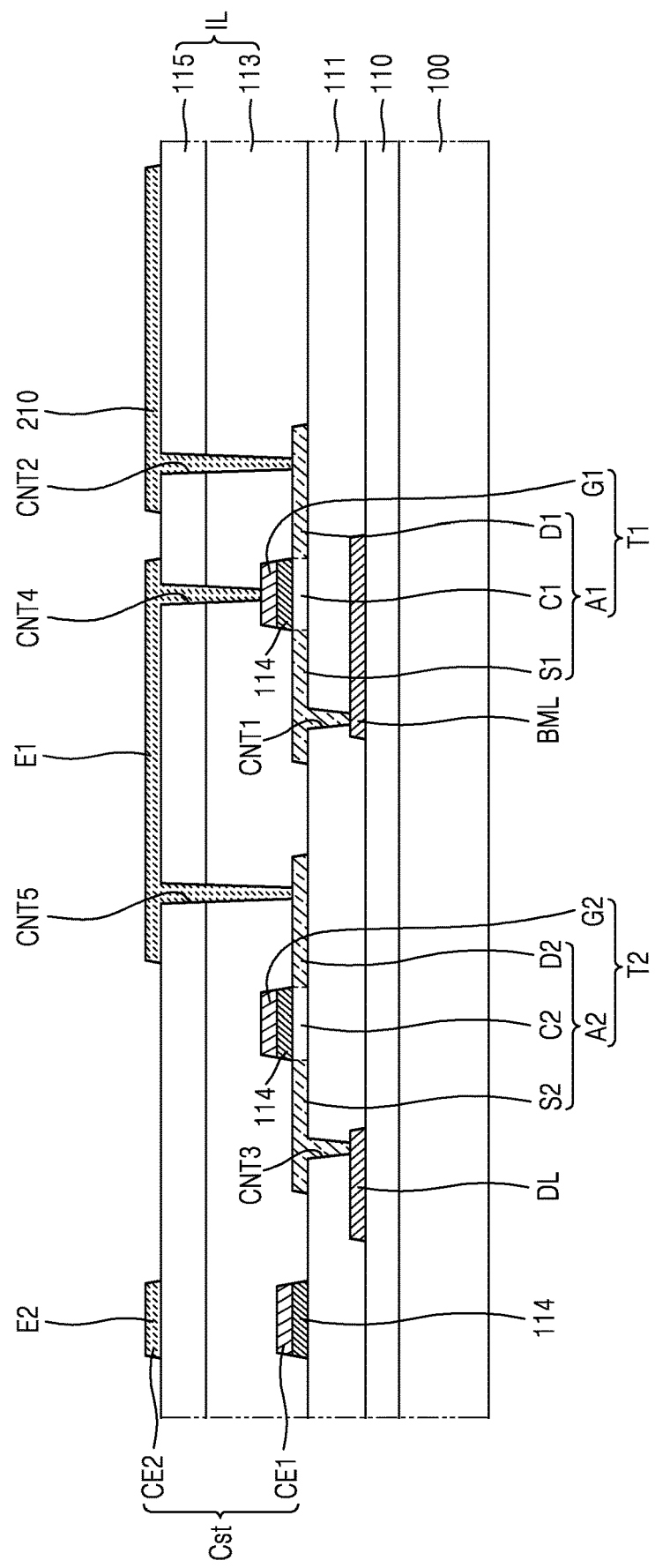

Referring to FIG. 6G, the pixel electrode 210, the first electrode layer E1, and the second electrode layer E2 are provided or formed on the planarization layer 115. The pixel electrode 210, the first electrode layer E1, and the second electrode layer E2 may be obtained by arranging a preliminary conductive layer (not shown) on the entire upper surface of the planarization layer 115, and performing a mask process and an etching process thereon. The pixel electrode 210, the first electrode layer E1, and the second electrode layer E2 are respective patterned portions of the preliminary conductive layer.

In an embodiment, the pixel electrode 210 may be connected to the first semiconductor layer A1 via the second contact hole CNT2, and the first electrode layer E1 may connect the first gate electrode G1 to the second semiconductor layer A2 via the fourth contact hole CNT4 and the fifth contact hole CNT5.

In an embodiment, the second electrode layer E2 may correspond to and/or define the upper electrode CE2 of the storage capacitor Cst.

Figure 6H:
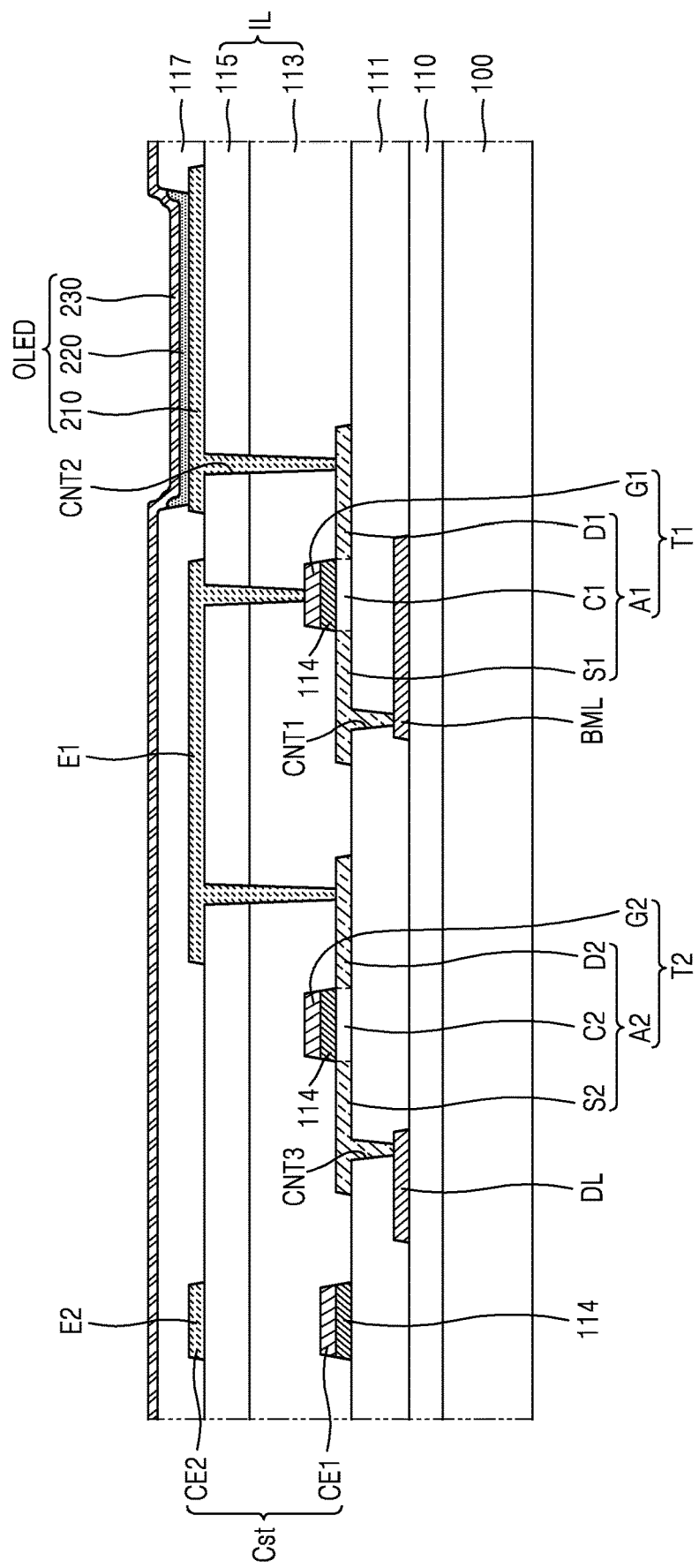

Referring to FIG. 6H, the pixel defining layer 117 is provided or formed on the entire upper surface of the planarization layer 115. The pixel defining layer 117 covers edges of the pixel electrode 210 and defines an opening (e.g., aperture) that exposes a central portion of the pixel electrode 210. The pixel defining layer 117 may include one or more organic insulating materials selected from polyimide, polyamide, acryl resin, benzo cyclobutene, and phenol resin, and may be manufactured by a spin coating method, etc. The aperture may define a light-emitting region of the display apparatus 1.

The intermediate layer 220 is provided or formed in the opening of the pixel defining layer 117. The intermediate layer 220 may include a relatively low-molecular weight organic material or a polymer material. The intermediate layer 220 may be provided or formed by a vacuum deposition method, a screen printing method, an inkjet printing method, a laser induced thermal imaging ("LITI") method, etc.

The opposite electrode 230 is provided or formed to correspond to the plurality of display elements such as the organic light-emitting diode OLED. The opposite electrode 230 may be provided to cover the display area DA (see FIG. 1) of the substrate 100 as a single, unitary pattern, such as through a process using an open mask. The opposite electrode 230 may be provided or formed by a deposition method such as a chemical vapor deposition method, a plasma enhanced CVD ("PECVD") method, a low pressure CVD ("LPCVD") method, a physical vapor deposition ("PVD") method, a sputtering method, an atomic layer deposition ("ALD") method, etc.

The opposite electrode 230 may include a transmissive electrode or a reflective electrode. In embodiments, the opposite electrode 230 may be a transparent or a semi-transparent electrode, and may be provided as a metal thin film including Li, Ca, LiF/Ca, LiF/Al, Al, Ag, Mg, and a combination thereof having a relatively small work function. Also, a transparent conductive oxide ("TCO") layer such as ITO, IZO, ZnO, or $In_2O_3$ may be further provided over the metal thin film.

As described above with reference to one or more embodiment, when the first semiconductor layer A1 is directly connected to the conductive layer BML via the first contact hole CNT1 in which the first semiconductor layer A1 is partially embedded, the bridge between transistors using a gate metal layer or the bridge between transistors using an electrode layer in a same layer as the pixel electrode 210 may be omitted. In this case, the first semiconductor layer A1 may not be partially exposed and removed through a patterning process, and the pixel circuit PC may be stabilized. Also, since the electrode layer for connecting the first semiconductor layer A1 to the conductive layer BML is not formed in a same layer as the pixel electrode 210, the aperture ratio may be constantly maintained.

According to one or more embodiments of the disclosure, the display apparatus 1 in which a light-emitting device having improved lifespan is provided may be implemented. However, the scope of the disclosure is not limited to the above effects.

It should be understood that embodiments described herein should be considered in a descriptive sense only and not for purposes of limitation. Descriptions of features within each embodiment should typically be considered as available for other similar features in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
   a substrate;
   a buffer layer on the substrate;
   a first thin film transistor facing the substrate with the buffer layer therebetween, the first thin film transistor comprising:
      a first semiconductor layer comprising an oxide semiconductor material, a first channel region, a first source region and a first drain region, and
      a first gate electrode facing the buffer layer with the first semiconductor layer therebetween;
   a conductive pattern which is facing the first semiconductor layer with the buffer layer therebetween and directly connected to the first semiconductor layer;
   a first contact hole in the buffer layer and exposing the conductive pattern to outside the buffer layer; and
   a display element which is electrically connected to the first thin film transistor and emits light,
   wherein the first source region or the first drain region of the first semiconductor layer extends through the first contact hole in the buffer layer, to directly contact the conductive pattern and directly connect the first semiconductor layer to the conductive pattern.

2. The display apparatus of claim 1, wherein the conductive pattern faces the first channel region with the buffer layer therebetween.

3. The display apparatus of claim 1, further comprising:
   an insulating layer facing the first semiconductor layer with the first gate electrode therebetween, and
   a second contact hole in the insulating layer, exposing the first semiconductor layer to outside the insulating layer,
   wherein the display element is connected to the first semiconductor layer of the first thin film transistor, at the second contact hole.

4. The display apparatus of claim 3, further comprising:
   a gate insulating pattern between the first semiconductor layer and the first gate electrode, the gate insulating pattern including side surfaces,
   the first gate electrode including side surfaces, and
   upper surfaces of the first source region and the first drain region which are furthest from the substrate,
   wherein the upper surfaces of the first source region and the first drain region, the side surfaces of the gate insulating pattern and the side surfaces of the first gate electrode are each in direct contact with the insulating layer.

5. The display apparatus of claim 3, wherein the first semiconductor layer comprises an N-type semiconductor.

6. The display apparatus of claim 5, wherein
   the display element is connected to the first drain region of the first semiconductor layer, at the second contact hole, and
   the first source region of the first semiconductor layer extends through the first contact hole in the buffer layer to directly contact the conductive pattern and directly connect the first semiconductor layer to the conductive pattern.

7. The display apparatus of claim 1, wherein the conductive pattern has a discrete shape in a direction along the substrate.

8. The display apparatus of claim 1, further comprising:
   a second thin film transistor comprising:
      a second semiconductor layer in a same layer as the first semiconductor layer, and
      a second gate electrode facing the buffer layer with the second semiconductor layer therebetween,
   a data line in a same layer as the conductive pattern and directly connected to the second semiconductor layer, and
   a third contact hole in the buffer layer and exposing the data line to outside the buffer layer,
   wherein the second semiconductor layer extends through the third contact hole in the buffer layer, to directly contact the data line and directly connect the second semiconductor layer to the data line.

9. The display apparatus of claim 8, wherein
   the first thin film transistor comprises a driving thin film transistor, and
   the second thin film transistor comprises a switching thin film transistor.

10. The display apparatus of claim 8, wherein the second semiconductor layer includes the oxide semiconductor material.

11. The display apparatus of claim 8, wherein
    the second semiconductor layer comprises a second channel region, a second source region and a second drain region, and
    the second source region or the second drain region extends through the third contact hole in the buffer layer, to directly contact the data line and directly connect the second semiconductor layer to the data line.

12. The display apparatus of claim 11, wherein the second semiconductor layer comprises an N-type semiconductor.

13. The display apparatus of claim 12, wherein the second source region of the second semiconductor layer extends through the third contact hole in the buffer layer, to directly contact the data line and directly connect the second semiconductor layer to the data line.

14. The display apparatus of claim 13, wherein
the first thin film transistor and the second thin film transistor are connected to each other, and
the first gate electrode extends from the first thin film transistor to directly contact the second drain region of the second thin film transistor and directly connect the first thin film transistor to the second thin film transistor at the second drain region.

15. The display apparatus of claim 13, further comprising:
the first thin film transistor and the second thin film transistor connected to each other,
an insulating layer facing the first semiconductor layer with the first gate electrode therebetween and facing the second semiconductor layer with the second gate electrode therebetween; and
an electrode pattern facing each of the first semiconductor layer and the second semiconductor layer, with the insulating layer therebetween,
wherein the electrode pattern connects the first thin film transistor and the second thin film transistor to each other, at the first gate electrode and the second drain region, respectively.

16. The display apparatus of claim 15, wherein the display element comprises:
a pixel electrode;
an opposite electrode facing the pixel electrode; and
an intermediate layer between the pixel electrode and the opposite electrode,
wherein the electrode pattern which connects the first thin film transistor and the second thin film transistor to each other is in a same layer as the pixel electrode of the display element.

17. The display apparatus of claim 15, further comprising:
a storage capacitor comprising a lower electrode and an upper electrode facing each other;
a driving voltage line to which a first voltage is applied; and
the second thin film transistor to which a second voltage is applied,
wherein the storage capacitor stores a voltage corresponding to a difference between the first voltage which is applied to the driving voltage line and the second voltage which is applied to the second thin film transistor.

18. The display apparatus of claim 17, wherein
the lower electrode of the storage capacitor is in same layer as both the first gate electrode and the second gate electrode, and
the upper electrode of the storage capacitor is in a same layer as the electrode pattern which connects the first thin film transistor and the second thin film transistor to each other.

19. The display apparatus of claim 1, further comprising a gate insulating pattern between the first semiconductor layer and the first gate electrode, the gate insulating pattern including side surfaces,
wherein the first source region and the first drain region of the first semiconductor layer extend further than the side surfaces of the gate insulating pattern.

20. The display apparatus of claim 19, further comprising the first gate electrode including side surfaces,
wherein the side surfaces of the gate insulating pattern and the side surfaces of the first gate electrode are coplanar with each other.

* * * * *